United States Patent [19]
Wei

[11] Patent Number: 5,595,790
[45] Date of Patent: Jan. 21, 1997

[54] METHOD FOR FORMING A REFLECTIVE SURFACE FOR A LCD

[75] Inventor: Chung-Kuang Wei, Hsinchu, Taiwan

[73] Assignee: Industrial Technology Research Institute, Hsinchu, Taiwan

[21] Appl. No.: 668,987

[22] Filed: Jun. 21, 1996

[51] Int. Cl.⁶ .................................................. C08J 7/04
[52] U.S. Cl. .................. 427/510; 204/192.1; 204/471; 427/162; 427/250; 427/259; 427/264; 427/265; 427/270; 427/272; 427/282; 427/294; 427/336; 427/352; 427/379; 427/385.5; 427/512; 427/558; 427/559; 427/581; 427/585; 427/595
[58] Field of Search ........................ 427/508, 510, 427/512, 558, 559, 581, 585, 595, 162, 250, 259, 264, 265, 270, 272, 282, 294, 336, 352, 379, 385.5; 204/192.1, 471

[56] References Cited

U.S. PATENT DOCUMENTS 5,204,765   4/1993   Mitsui et al. .................. 359/70
5,220,444   6/1993   Mitsui et al. .................. 359/70

OTHER PUBLICATIONS

Mitsui et al, "Bright Reflective Multicolor LCDs addressed by a Si TFTs" published in SID 1992 Digest, p. 437–440 (no month available).

*Primary Examiner*—Bernard Pianalto
*Attorney, Agent, or Firm*—George O. Saile

[57] ABSTRACT

An effective non-specular reflector, for use in a Liquid Crystal Display, is formed by first coating a substrate with a two component solution. One component hardens when heated or when exposed to ultraviolet light (optionally through a mask) while the other component remains liquid. The result is a solid layer in which are dispersed multiple liquid regions, some of which break the surface where they are easily removed, leaving behind a roughened surface. Once a high reflectance metal has been deposited onto this surface it becomes an effective nonspecular reflector. Examples of materials for use as the two components are given.

14 Claims, 3 Drawing Sheets

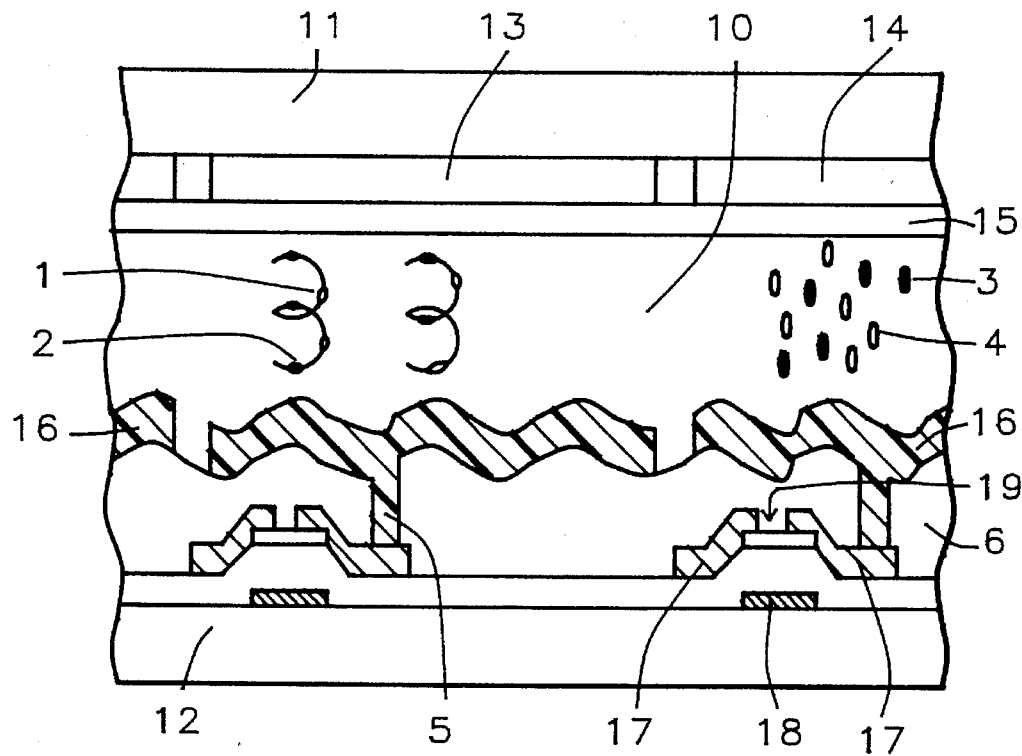
FIG. 1 - Prior Art
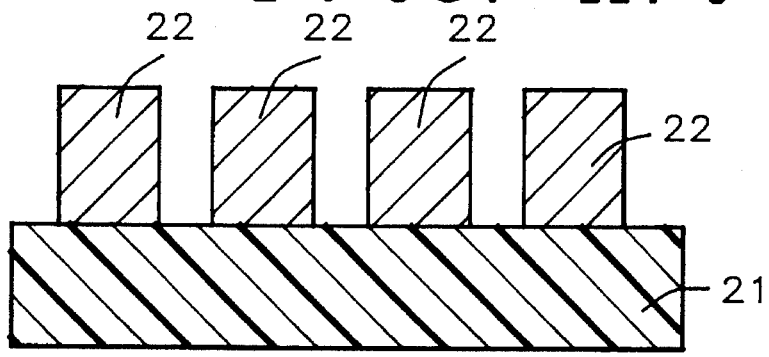
FIG. 2a - Prior Art
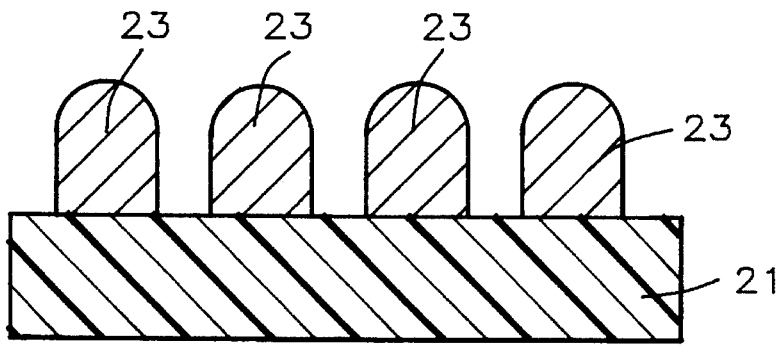
FIG. 2b - Prior Art

METHOD FOR FORMING A REFLECTIVE SURFACE FOR A LCD

BACKGROUND OF THE INVENTION (1) Field of the Invention

The invention relates to the general field of ambient lit Liquid Crystal Displays, more particularly to the design of the reflective layer.

(2) Description of the Prior Art

First generation liquid crystal displays involve a number of layers, the outermost being a pair of crossed polarizers. In the most commonly used configuration, the polarizers are arranged so as to have their optic axes orthogonal to one another. That is, in the absence of anything else between them, light passing through the entrance polarizer would be blocked by the exit polarizer, and vice versa.

Conducting lines running orthogonal to, and insulated from, one another are located on the inside surfaces. These lines are connected at their intersections through Thin Film Transistors (TFTS). The TFTs allow voltage, separately applied to a set of orthogonal lines, to be added together only at the intersecting position which will overlie a given pixel (or sub-pixel) of the display.

Sandwiched between, and confined there by means of suitable enclosing walls, is a layer of liquid crystal. Liquid crystals comprise long molecules, referred to as nematic, or thread-like. The orientation of these molecules, relative to a given surface can be controlled by coating such a surface with a suitable orientation layer which is rubbed in the desired direction just prior to bringing it into contact with the liquid crystals.

Thus, the molecules closest to the upper substrate would be oriented so as to lie in one plane while the molecules closest to lower substrate would be oriented to lie perpendicular to this plane. Molecules in between the two sets of pre-oriented molecules then arrange themselves so as to gradually change their orientations between these two extremes. Hence the term 'twisted nematic' (TN) for such a configuration. A TN is optically active and will rotate the plane of any polarized light that traverses it so that polarized light that was formed and oriented as a result of passing through an entrance polarizer will be rotated though an angle of 90° after traversing the liquid crystal and so will be correctly oriented to pass through the exit polarizer. Such a device is therefore normally on (transmits light).

An important property of TN is that, in the presence of an electric field (typically about 10 kV/cm.), normal to the molecules, said molecules will all orient themselves so as to point in the same direction and the liquid crystal layer will cease to be optically active.

At the present time colored LCDs are built in the same way as monochrome LCDs but their light has been passed through multicolor filters. The latter consists of a matrix of sub-pixel size regions on a common substrate, each region being a tiny color filter. The spatial locations of the different colored regions are known to the liquid crystal display control system which determines the amount of light that is allowed to pass beyond any given dot, thereby creating a color image.

To view the display, light is applied from outside the entrance polarizer and then viewed by looking through the exit polarizer. This implies an independent light source as part of the overall display, adding significantly to its power requirements. In general, it would be preferable to be able to view the display using ambient light alone. In principle this could be achieved by locating a reflecting surface on the inside surface of the exit polarizer and then viewing the display directly.

In practice, this arrangement does not work well with LCDs of the type just described because the polarizers absorb a significant fraction of the incident light, often in excess of 50%. As a result, a new generation of LCDs are currently being developed that do not require the presence of a pair of polarizers.

FIG. 1 is a schematic cross-section of a LCD that operates without the need for polarizers. The figure is taken from a paper by Mitsui et al. "Bright reflective multicolor LCDs addressed by a-Si TFTs" published in SID 92 Digest pp. 437–440. Liquid crystal 10 is confined between upper and lower substrates 11 and 12 respectively, including sub-pixel sized color filters 13 and 14 and transparent conducting electrode 15. An electric field may be selectively applied between 15 and any one of lower electrodes 16.

Selection of a particular electrode is effected by means TFTs located at the intersections of the orthogonal addressing lines, as already discussed above. Source/drain electrodes 17 contact amorphous silicon layer 19, current through which is controlled from gate electrode 18. Lower electrodes 16 contact the TFTs through via holes such as 5.

In the example illustrated in FIG. 1, the sub-pixel corresponding to filter 13 is off, while the the sub-pixel corresponding to filter 14 is on. Two TN spirals are shown below 13. The liquid crystal molecules are schematically shown as open ellipses such as 1. The black ellipses represent black dye molecules that have been added to the liquid crystal. Rather than being randomly oriented within their LC host, these dye molecules follow the orientations of the LC molecules, in this case a spiral. In this configuration, the dye molecules block the passage of light through them.

Continuing to refer to FIG. 1, the sub-pixel corresponding to filter 14 is on. That is, an electric field has been applied across the LC/dye mixture. This causes the LC molecules, such as 4, to line up with the field. Dye molecules, such as 3, follow the orientation of the LC molecules and, now, do not block the passage of light through them. This type of LCD is said to be in phase change guest host (PCGH) mode.

Since the display of FIG. 1 is free of light absorbing polarizers, it can be viewed in ambient light applied from above upper substrate 11. Reflection of the light occurs at the surface of layer 16. It is important to note that layer 16 must not be a planar surface. If it were, the display would behave as an optical interference filter and transmit only a limited range of optical frequencies. Thus it becomes necessary to ensure that reflection at the top surface of layer 16 be non-specular.

A number of approaches to providing non-specular reflecting surfaces for use in LCDs have been described in the prior art. For example, Mitsui et al. (U.S. Pat. No. 5,204,765 April 1993), as illustrated in FIG. 2a, deposit a layer of resin on substrate 21 and then pattern and etch it to form an array of tiny pedestals 22 sticking out from the surface. The pedestals are then subjected to a heat treatment which causes them to assume a rounded shape somewhat akin to a set of convex lenses. These are shown as 23 in FIG. 2b. A reflective metallic layer is then deposited over convexities 23.

A different method for forming the non-specular reflector has been disclosed by Mitsui et al. in U.S. Pat. 5,220,444 Jun 1993. A layer of oxide is first deposited and then etched in a manner that results in a roughened surface. The latter is then given a metallic coating.

Both the above methods involve extra steps. Additionally, the first method results in a surface that is non-planar but its non-specularity follows an even pattern (which is not desirable from an optical standpoint), while the non-specularity of the second method is hard to predict.

SUMMARY OF THE INVENTION

It has been an object of the present invention to provide methods for manufacturing a surface suitable for use as a nonspecular reflector in a Liquid Crystal Display.

Yet another object of the invention has to been to make such a surface available in either continuous or patterned form.

Still another object of the invention has been to pattern the layer at the same time that its non-specular surface is being formed.

These objects have been achieved by use of a two component solution. One component hardens when heated or when exposed to ultraviolet light while the other component remains liquid. The result is a solid layer in which are dispersed multiple liquid regions, some of which break the surface where they are easily removed, leaving behind a roughened surface. Once a high reflectance metal has been deposited onto this surface it becomes an effective non-specular reflector.

BRIEF DESCRIPTION OF THE DRAWINGS

FIG. 1 shows a LCD design of the prior art that does not use crossed polarizers.

FIGS. 2a and 2b show a prior art method for forming a nonspecular surface for use as a reflector.

DESCRIPTION OF THE PREFERRED EMBODIMENTS

The present invention provides a method for forming a nonspecular reflecting surface for use in a liquid crystal display. The underlying principle on which this method is based is that, if one component of a single phase, two component solution is caused to harden, without affecting the other component, the result is a solid which has dispersed in it many pockets, or regions, of liquid. Some of these liquid regions will be close enough to the surface of the solid to penetrate it and be exposed to the outside. These exposed liquid regions are then removed and a roughened surface results.

The present invention considers two possible ways to cause the above described selective hardening. These are exposure to ultraviolet (UV) light and heating. If the exposure to UV method is used it offers the additional advantage that the exposure may be selective, as, for example exposure through a mask. Thus, in designs where a via hole is required to pass through the reflector (see for example FIG. 1), surface roughening and via hole formation can be effected in a single operation.

Figure 3:
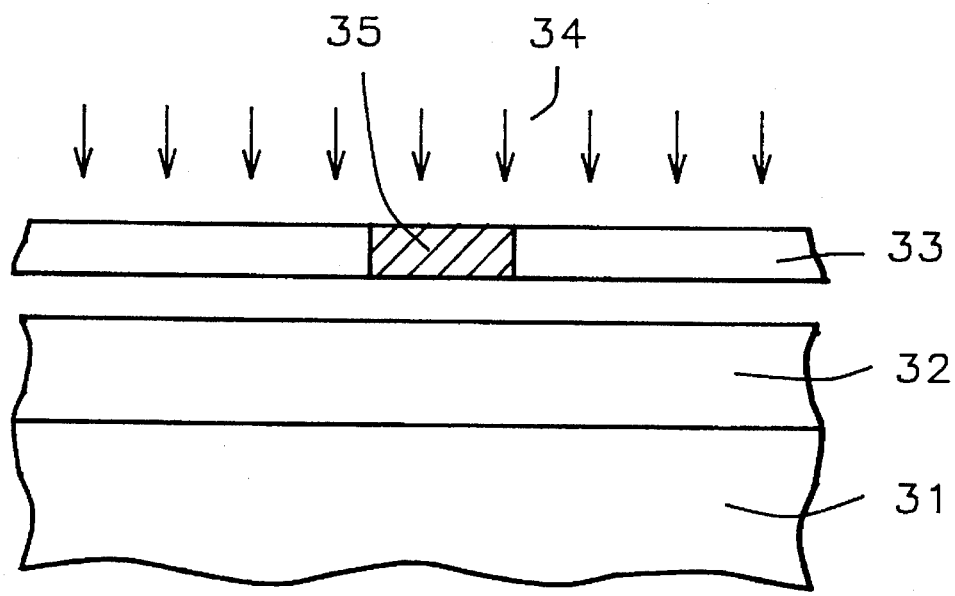
FIG. 3, 4, 5 and 6 illustrate successive steps using the method of the present invention to prepare a non-specular surface.

Referring now to FIG. 3, we illustrate the above described process. Two component, single phase liquid 32 has been deposited as a layer on the surface of substrate 31 by means of spin coating or print slot coating. One component of 32 will harden when exposed to UV while the other will not. Thus when 32 is exposed to UV 34 through mask 33, a portion of which, 35, is opaque to UV, as shown in FIG. 4, former all liquid layer 32 has been replaced by solid layer 42 which has dispersed in it many regions of liquid (not explicitly shown).

Figure 4:
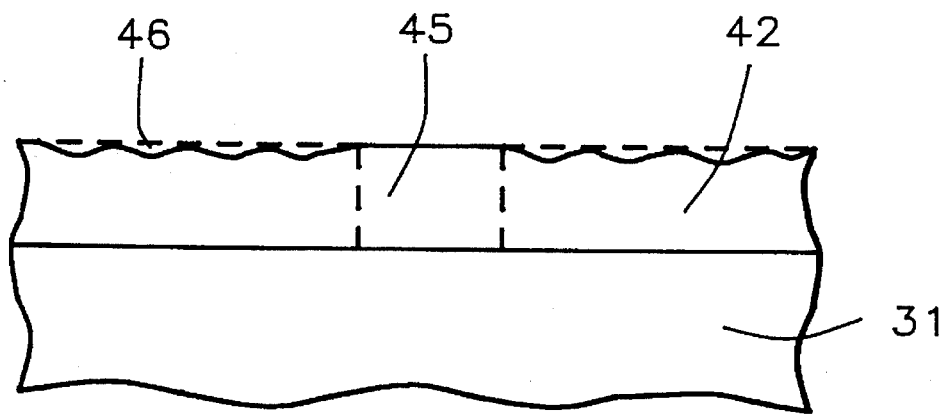
Figure 5:
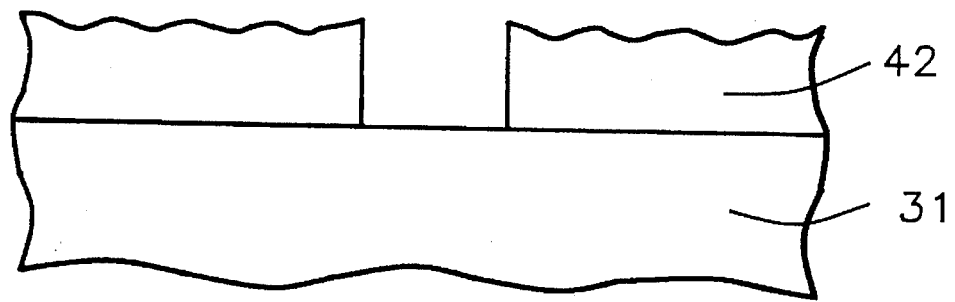

Continuing our reference to FIG. 4, portion 45 of layer 42, which was not exposed to the UV, remains all liquid. Liquid regions close enough to the surface of 42 to be exposed to the outside are collectively designated as 46. Once 45 and 46 are removed by, for example, rinsing in acetone, water, isopropyl alcohol, or sodium hydroxide solutions, the result is as shown in schematic cross-section in FIG. 5.

Figure 6:
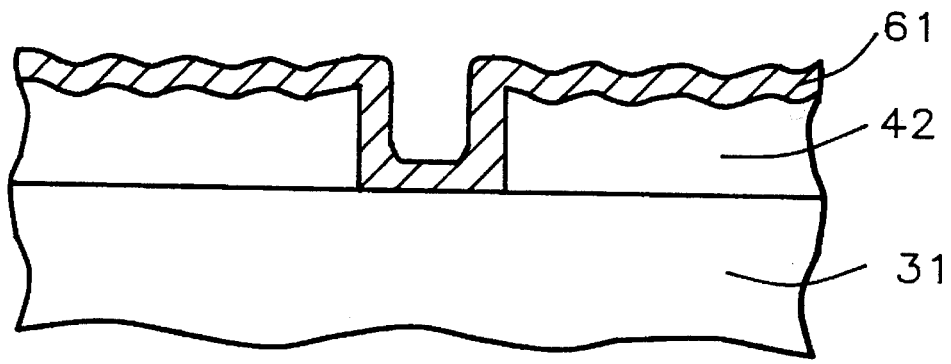

All that remains for the formation of a non-specular reflector is to deposit a suitable metallic layer (designated 61 in FIG. 6) over the deplanarized surface of layer 42. Metals such as aluminum, silver, chromium, or molybdenum may be used. These may be deposited by any of several possible methods, including sputtering, vacuum evaporation, chemical vapor deposition, and elecrodeposition.

As an example of a two liquid component system that behaves as described above we cite a one phase solution or liquid component of a liquid crystal and another liquid component of a photosensitive monomer. For the monomer we have used a product of the Norland Corporation called NOA65 which consists of trimethololpropane diallyl ether, trimethololpropane tris thiol, isophorone diisocynate ester, and benzophenone photoinitiator. For the liquid crystal we have used a product of the Merck Corporation called E7 which consists of cyano compounds, terphenyl, cyclohexylphenyl, cyclohexylbiphenyl, and two other biphenyls.

We have used relative concentrations, by weight, of 2:1 of monomer:liquid crystal but any concentration ratio from about 10 to 0.1:1 would work.

While the invention has been particularly shown and described with reference to the preferred embodiments thereof, it will be understood by those skilled in the art that various changes in form and details may be made without departing from the spirit and scope of the invention.

What is claimed is:

1. A method for forming a non-specular reflecting surface for use in a liquid crystal display comprising:

providing a solution consisting of a first component, that is subject to hardening when exposed to ultraviolet light, and a second component that is not subject to hardening when exposed to ultraviolet light;

providing a substrate;

coating said substrate with a layer of the solution;

exposing the solution to ultraviolet light thereby transforming the solution to a solid layer, having an upper surface, wherein are dispersed liquid regions;

removing said liquid regions wherever they are part of said upper surface, thereby deplanarizing said surface;

heating the layer to solidify said liquid regions; and depositing a layer of a reflective material on said deplanarized upper surface.

2. The method of claim 1 wherein said first liquid component is a photosensitive monomer.

3. The method of claim 2 wherein said photosensitive monomer further comprises:

trimethololpropane diallyl ether, trimethololpropane tris thiol, isophorone diisocynate ester, and benzophenone photoinitiator.

4. The method of claim 1 wherein said second liquid component is a liquid crystal.

5. The method of claim 4 wherein said liquid crystal further comprises:

cyano compounds,
terphenyl,
cyclohexylphenyl,
cyclohexylbiphenyl, and
two other biphenyls.

6. The method of claim 1 wherein the ratio of the concentrations of said first and second liquid components in said solution is between about 10 and 0.1 to 1, by weight.

7. The method of claim 1 wherein the step of exposing to ultraviolet light is performed through a mask.

8. The method of claim 1 wherein the method for coating the substrate with the solution is spin coating.

9. The method of claim 1 wherein said reflective material is taken from the group consisting of aluminum, silver, chromium and molybdenum.

10. The method of claim 1 wherein the method for depositing the metallic layer is taken from the group consisting of sputtering, vacuum evaporation, chemical vapor deposition, and electrodeposition.

11. A method for forming a non-specular reflecting surface for use in a liquid crystal display comprising:
providing a solution consisting of a first component;
providing a substrate;
coating said substrate with a layer of the solution;
subjecting the solution to a first heat treatment thereby transforming the solution to a solid layer, having an upper surface, wherein are dispersed liquid regions;
removing said liquid regions wherever they are part of said upper surface, thereby deplanarizing said surface;
subjecting the layer to a second heat treatment to solidify said liquid regions; and
depositing a layer of a reflective material on said deplanarized upper surface.

12. The method of claim 11 wherein said first liquid component is a heat sensitive monomer.

13. The method of claim 11 and further comprising a second liquid component which is a liquid crystal.

14. The method of claim 13 wherein the ratio of the concentrations of said first and second liquid components in said solution is between about 10 and 0.1 to 1, by weight.

* * * * *